(12) United States Patent
Lee

(10) Patent No.: US 7,341,942 B2
(45) Date of Patent: Mar. 11, 2008

(54) METHOD FOR FORMING METAL LINE OF SEMICONDUCTOR DEVICE

(75) Inventor: Jae Suk Lee, Suwon (KR)

(73) Assignee: Dongbu Electronics Co., Ltd, Seoul (KR)

(*) Notice: Subject to any disclaimer, the term of this patent is extended or adjusted under 35 U.S.C. 154(b) by 84 days.

(21) Appl. No.: 11/312,353

(22) Filed: Dec. 21, 2005

(65) Prior Publication Data
US 2006/0141781 A1 Jun. 29, 2006

(30) Foreign Application Priority Data
Dec. 24, 2004 (KR) ................ 10-2004-0112035

(51) Int. Cl.
*H01L 21/283* (2006.01)
(52) U.S. Cl. ............... 438/642; 438/677; 438/679; 438/688; 438/761; 438/763
(58) Field of Classification Search ........... 438/642, 438/677, 679, 688, FOR. 405, 761, 763
See application file for complete search history.

(56) References Cited

U.S. PATENT DOCUMENTS 5,932,492 A * 8/1999 Hahm et al. .............. 438/737
6,077,571 A * 6/2000 Kaloyeros et al. .......... 427/576
6,194,037 B1 * 2/2001 Terasaki et al. ............ 427/569

FOREIGN PATENT DOCUMENTS

JP 2000-183168 6/2000
KR 10-2001-0065194 A 7/2001

* cited by examiner

*Primary Examiner*—George Fourson
*Assistant Examiner*—Joannie Adelle Garcia
(74) *Attorney, Agent, or Firm*—McKenna Long & Aldridge LLP

(57) ABSTRACT

A method for forming a metal line of a semiconductor device forms an aluminum line having an excellent orientation. A specific resistance of a metal line is reduced, thereby enabling sufficient supply of a desired electric current. The method includes steps of forming a lower reflection preventing layer on a silicon wafer, forming a first aluminum layer on the lower reflection preventing layer, forming a second aluminum layer on the first aluminum layer, lowering a surface roughness of the second aluminum layer, forming an upper reflection preventing layer on the second aluminum layer, and forming an aluminum line.

9 Claims, 4 Drawing Sheets

METHOD FOR FORMING METAL LINE OF SEMICONDUCTOR DEVICE

This application claims the benefit of Korean Patent Application No. 10-2004-0112035, filed on Dec. 24, 2004, which is hereby incorporated by reference for all purposes as if fully set forth herein.

BACKGROUND OF THE INVENTION

1. Field of the Invention

The present invention relates to semiconductor devices, and more particularly, to a method for forming a metal line of a semiconductor device having a favorable orientation, namely, a <111> orientation.

2. Discussion of the Related Art

Metallization is a process for connecting respective components of a semiconductor device with a low resistance by forming contact portions on the semiconductor device to connect inner circuits of chip and package. The metallization metal should exhibit excellent adhesion to a thin layer, such as a silicon (Si) or silicon oxide ($SiO_2$) layer, and exhibit a high conductivity when reacted with silicon. The metallization metal should also resist heat and mechanical stresses. The metal should also have low resistance for ohmic contacts and should exhibit good ohmic contact properties with respect to inner circuits.

When such a metal is used in a metallization for forming a metal line on the semiconductor device, the metal line must have a strong resistance to corrosion and oxidation. The metal line must also resist the problems of electron migration and stress migration. Aluminum, rather than other noble metals, is the most widely used material, since aluminum exhibits excellent adhesion to silicon or silicon oxide, can realize a good ohmic contact with heavily doped $n^+$ or $p^+$-silicon, has a low specific resistance of about 2.7 $\mu\Omega$cm, and is inexpensive.

Due to high integration of commercial semiconductor devices including DRAM, metal lines are reduced in width and suffer from easy cut-off of the metal wire. The cut-off of the metal wire is due to collision between electrons and aluminum ions upon migration of the electrons through the aluminum line.

In general, when an aluminum layer is deposited by sputtering, it has defects such as hillocks or dislocations, which deteriorate electrical properties when electrons migrate through the aluminum layer.

In addition, annealing is generally performed at a temperature of approximately 400 to 450° C. after deposition of an aluminum alloy. During this process, silicon is non-uniformly diffused from a bonding interface between the aluminum layer and a silicon substrate to the aluminum layer.

As a result, silicon is gradually consumed to cause a reduction in the bonding area, and the aluminum layer infiltrates into the silicon layer in order to fill a vacancy caused by the non-uniform diffusion of silicon. A spike-shaped portion is thereby formed. When a high electric field is applied to the spike portion, the bonding between the aluminum layer and the silicon substrate is broken, causing an increase in current leakage and thus deteriorating the properties of the semiconductor device.

FIGS. 1A and 1B are cross-sectional views of an aluminum line of a semiconductor device fabricated according to a related art method.

As shown in FIG. 1A, an insulating layer 12, a lower reflection preventing layer 13 of titanium/titanium nitride (Ti/TiN), and an aluminum layer 14 are sequentially deposited on a silicon wafer 11. An upper reflection preventing layer 15 of titanium/titanium nitride is formed on the aluminum layer 14.

As shown in FIG. 1B, the upper reflection preventing layer 15, the aluminum layer 14, and the lower reflection preventing layer 13 are selectively removed by photoresist and etching processes to form an aluminum line 20 having a desired width.

An interlayer insulating layer (not shown) is then formed over the entire surface of the semiconductor substrate 11 as well as the aluminum line 20 and is selectively removed to form a contact hole (not shown). Thereafter, another aluminum line (not shown) is formed to electrically connect to the aluminum line 20 through the contact hole.

The related art aluminum line has been developed as a semiconductor line irrespective of a copper line. In particular, the aluminum used is under a 0.13 μm design-rule in order to maintain reliability. As the width of the aluminum line is narrowed, however, a gap-filling problem occurs in subsequent inter-metal dielectrics. The gap-filling problem generally necessitates a thinning of the aluminum line. The reduction in width of the aluminum line also increases its resistance so that sufficient current cannot be supplied. Furthermore, as an operating voltage is reduced due to miniaturization of transistors, a specific resistance of the aluminum line becomes a serious issue.

SUMMARY OF THE INVENTION

Accordingly, the present invention is directed to a method for forming a metal line of a semiconductor device that substantially obviates one or more problems due to limitations and disadvantages of the related art.

An advantage of the present invention is to provide a method for forming a metal line of a semiconductor device, which can lower a specific resistance through formation of an aluminum line having an excellent orientation.

Additional features and advantages of the invention will be set forth in part in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method for forming a metal line of a semiconductor device includes forming a lower reflection preventing layer on a silicon wafer, forming a first aluminum layer on the lower reflection preventing layer, forming a second aluminum layer on the first aluminum layer, lowering a surface roughness of the second aluminum layer, forming an upper reflection preventing layer on the second aluminum layer, and forming an aluminum line.

In another aspect of the present invention, a method for forming a metal line of a semiconductor device includes forming a lower reflection preventing layer on a silicon wafer, forming a first aluminum layer on the lower reflection preventing layer by sputtering using a helium plasma, forming a second aluminum layer on the first aluminum layer by sputtering using a plasma of one of krypton, xenon, radon, and any combination thereof, lowering a surface roughness of the second aluminum layer, forming an upper reflection preventing layer on the second aluminum layer, and forming an aluminum line by selectively etching the upper reflection preventing layer, second aluminum layer, first aluminum layer, and lower reflection preventing layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings.

Figure 1A:
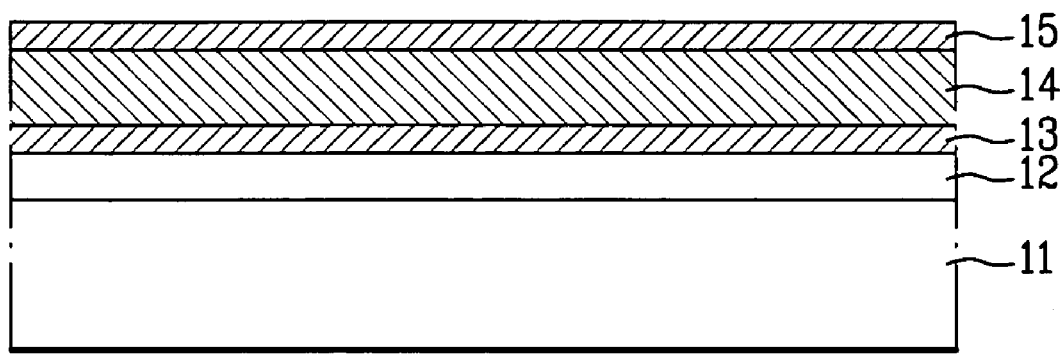
FIGS. 1A and 1B are cross-sectional views of an aluminum line of a semiconductor device fabricated according to a related art method.
Figure 1B:
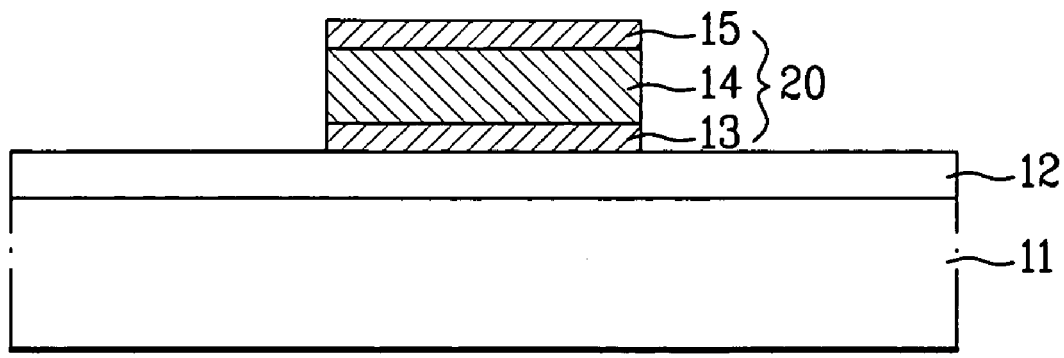
Figure 2:
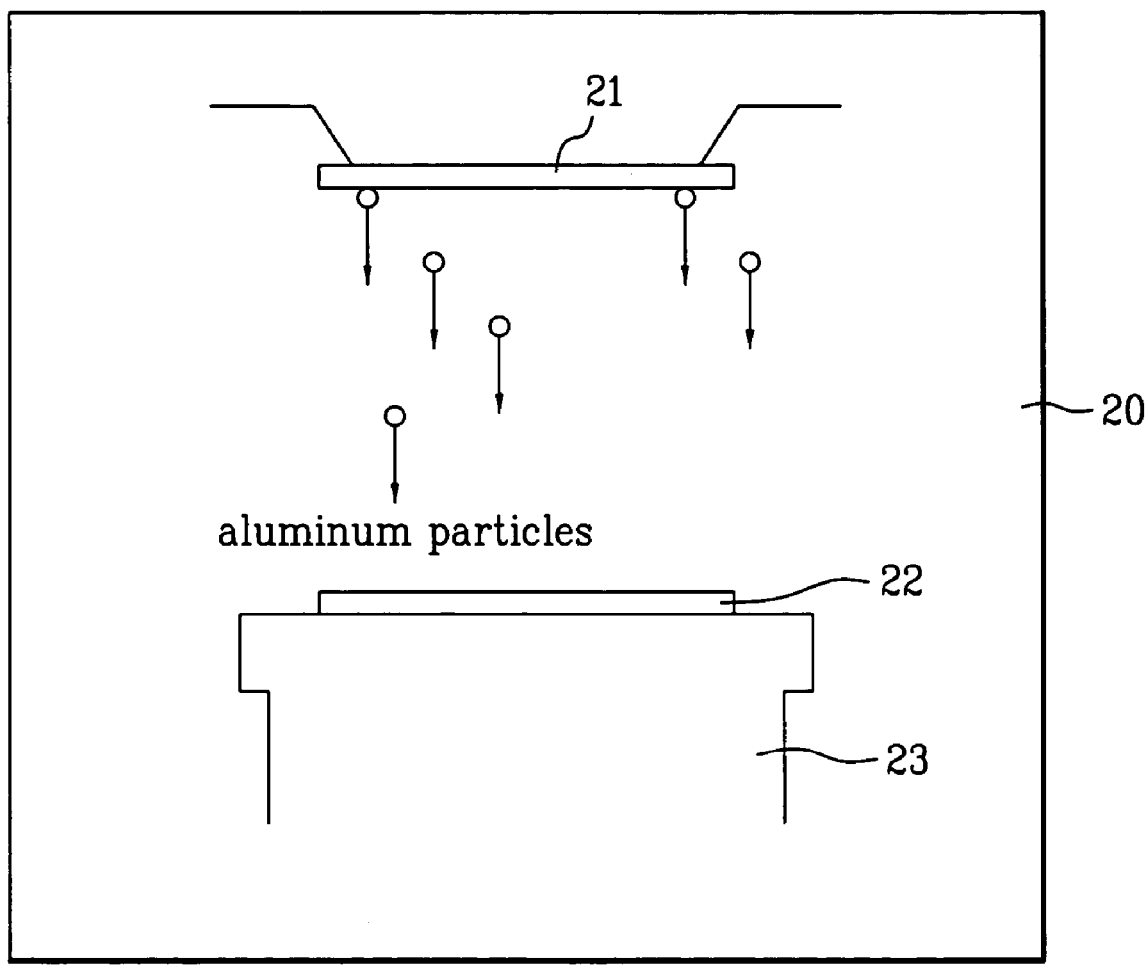
FIG. 2 is a schematic diagram of a sputtering apparatus for deposition of an aluminum thin film according to an exemplary embodiment of the present invention.

FIG. 2 illustrates a sputtering apparatus for deposition of an aluminum thin film according to an exemplary embodiment of the present invention. The sputtering apparatus may include a chamber 20 with an aluminum target 21 positioned at an upper portion of the chamber 20. A wafer 22 is positioned at a lower portion of the chamber 20. A table 23 is positioned under the wafer 22 to support the wafer 22. When reaction gas is injected into the chamber 20, it collides with the aluminum target 21, so that aluminum particles accumulate onto the wafer 22 positioned on the table 23. Thus, an aluminum layer is deposited on the wafer 22.

FIGS. 3A-3E are cross-sectional views of a metal line of a semiconductor device, illustrating respective steps of a method for forming a metal line according to an exemplary embodiment of the present invention.

Figure 3A:
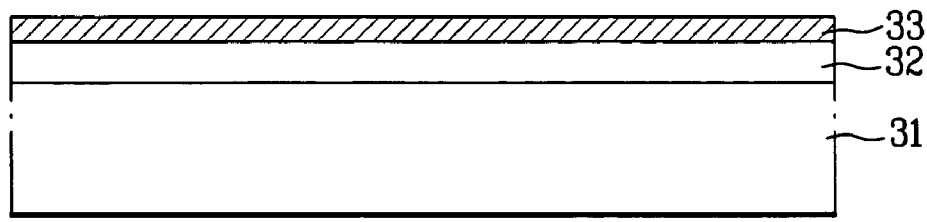
FIGS. 3A-3E are cross-sectional views of a metal line of a semiconductor device, illustrating respective steps of a method according to an exemplary embodiment of the present invention.

As shown in FIG. 3A, after forming an insulating layer 32 on a silicon wafer 31, a titanium/titanium nitride layer may be deposited on the insulating layer 32 by sputtering, to form a lower reflection preventing layer 33 on the insulating layer 32.

Figure 3B:
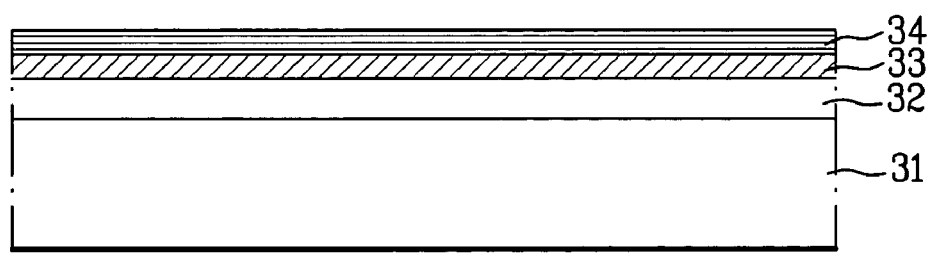

As shown in FIG. 3B, the silicon wafer 31, having the lower reflection preventing layer 33 formed thereon, may be conveyed into the chamber 20 of FIG. 2. A first aluminum layer 34 is formed on the lower reflection preventing layer 33. The first aluminum layer 34 may be formed by sputtering. The first aluminum layer 34 may be formed on the lower reflection preventing layer 33 via introduction of helium plasma to the chamber 20 at a very low pressure of not more than about 0.1 mTorr while maintaining a distance of about 20 mm between the aluminum target 21 and the wafer 22 within the chamber 20. Since aluminum molecules reach the surface of the lower reflection preventing layer 33 at a very low speed, due to the helium plasma being introduced into the chamber 20, the aluminum molecules are grown on a stable site before arrival of a second molecule layer. Thus, the aluminum molecules are stably grown to a plurality of layers. That is, after a monolayer of an excellent <111> orientation is formed on the lower reflection preventing layer 33, another monolayer is formed thereon. The formation of the <111> orientation is due to a columnar structure of the lower reflection preventing layer 33, which may be constituted by a titanium/titanium nitride layer.

Figure 3C:
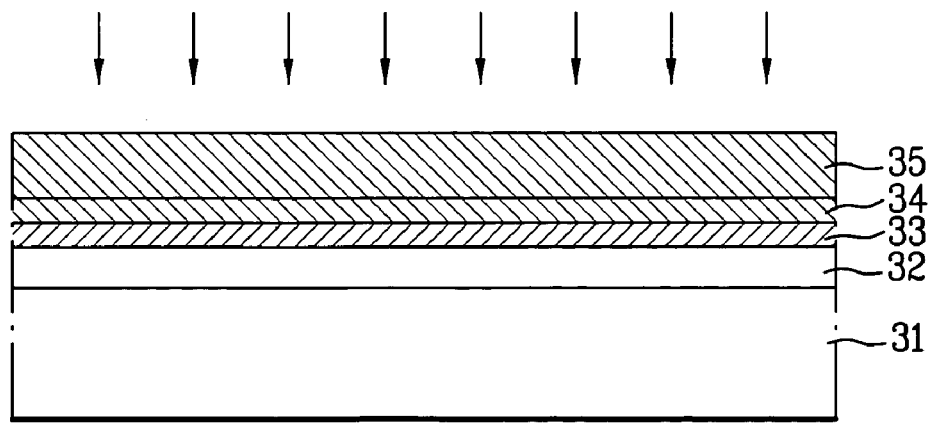

As shown in FIG. 3C, when the aluminum layer is deposited to approximately 20% to 30% of a desired thickness of a total aluminum layer within the chamber 20, i.e., the combined thickness of the first and second aluminum layers, injection of the helium plasma is terminated. Then, a gas mixture of krypton, xenon, and radon may be injected into the chamber 20 until the chamber 20 has a pressure of at least 5 mTorr.

The distance between the aluminum target 21 and the wafer 22 may be narrowed to about 5 mm within the chamber 20. After the distance is narrowed, strong plasma may be introduced to form a second aluminum layer 35. Since the first aluminum layer 34 already has the <111> orientation, it is possible to deposit the second aluminum layer 35 with a <111> orientation, irrespective of a quick deposition by the strong plasma. By stacking the first and second aluminum layers 34 and 35 having the <111> orientation, a high productivity can be maintained.

However, formation of a subsequent reflection preventing layer may be difficult due to an increased roughness and surface damage caused by a plasma of heavy elements, e.g., krypton, xenon, and radon. To solve this problem, when the second aluminum layer 35 is deposited to approximately 70 to 80% of the desired thickness of the total aluminum layer, i.e., the combined thickness of the first and second aluminum layers, the surface roughness of the second aluminum layer 35 may be improved by back-etching the film. The back-etching may be performed by exchanging the krypton, xenon, and radon gas injected into the chamber 20 with neon or a neon and helium mixture, followed by applying an RF bias at a pressure of 1 mTorr. The RF bias may be applied to the wafer 22 side and not the target 21 side.

Figure 3D:
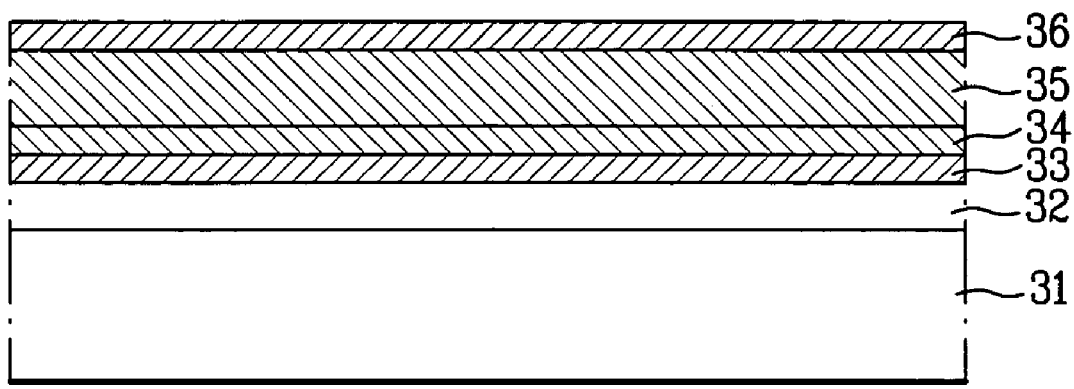

As shown in FIG. 3D, an upper reflection preventing layer 36 is formed on the second aluminum layer 35. The upper reflection preventing layer 36 may be made of titanium/titanium nitride and may be formed by sputtering. Deposition of the first and second aluminum layers 34 and 35 may be performed in a different chamber from that of the chamber used in forming the lower and upper reflection preventing layers 33 and 36.

Figure 3E:
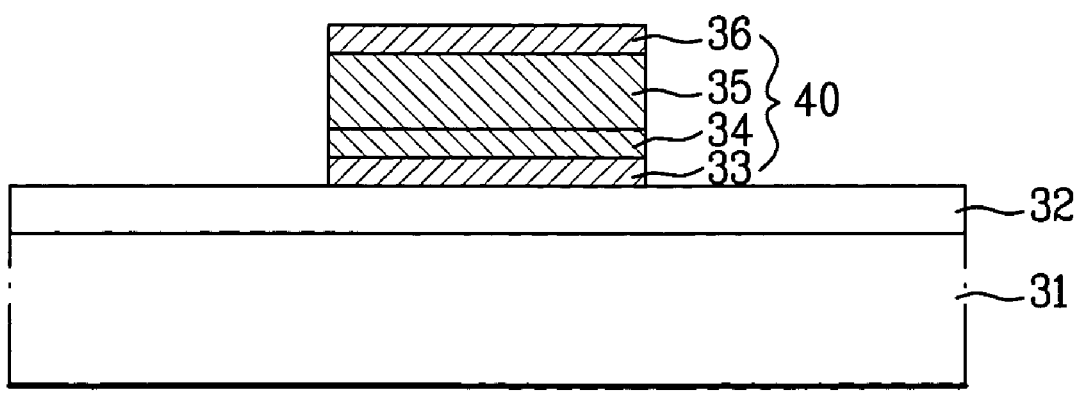

As shown in FIG. 3E, the upper reflection preventing layer 36, the second aluminum layer 35, the first aluminum layer 34, and the lower reflection preventing layer 33 may be selectively etched to form an aluminum line 40 through photoresist and etching processes.

As apparent from the above description, an aluminum line having a <111> orientation is formed so as to reduce the specific resistance of the metal line, thereby enabling sufficient supply of desired electric current.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for forming a metal line of a semiconductor device, comprising:

forming a lower reflection preventing layer on a silicon wafer;

forming a first aluminum layer on the lower reflection preventing layer by sputtering using a helium plasma;

forming a second aluminum layer on the first aluminum layer by sputtering using a plasma of one of krypton, xenon, radon, and any combination thereof;

lowering a surface roughness of the second aluminum layer;

forming an upper reflection preventing layer on the second aluminum layer; and forming an aluminum line by selectively etching the upper reflection preventing layer, second aluminum layer, first aluminum layer, and lower reflection preventing layer.

2. The method according to claim 1, wherein the sputtering is performed at a pressure of not more than 0.1 mTorr.

3. The method according to claim 1, wherein the sputtering is performed while a distance of about 20 mm is maintained between a target and the wafer.

4. The method according to claim 1, wherein the first aluminum layer has a thickness of approximately 20% to 30% of a combined thickness of the first aluminum layer and the second aluminum layer.

5. The method according to claim 1, wherein the second aluminum layer has a thickness of approximately 70% to 80% of a combined thickness of the first aluminum layer and the second aluminum layer.

6. The method according to claim 1, wherein the sputtering is performed at a pressure of at least 5 mTorr.

7. The method according to claim 1, wherein the sputtering is performed after narrowing a distance between a target and the wafer to about 5 mm.

8. The method according to claim 1, wherein lowering the surface roughness is performed by back-etching over an entire surface of the second aluminum layer, using a plasma of one of neon and a mixture of neon and helium.

9. A method for forming a metal line of a semiconductor device, comprising:

forming a lower reflection preventing layer on a silicon wafer;

forming a first aluminum layer on the lower reflection preventing layer by sputtering using helium plasma;

forming a second aluminum layer on the first aluminum layer by sputtering using a plasma of one of krypton, xenon, radon, and any combination thereof;

lowering a surface roughness of the second aluminum layer;

forming an upper reflection preventing layer on the second aluminum layer; and forming an aluminum line.

* * * * *